United States Patent
Damaschke et al.

(10) Patent No.: US 6,351,884 B1
(45) Date of Patent: Mar. 5, 2002

(54) PROCESS FOR MANUFACTURING PRINTED CIRCUIT BOARDS AND PROCESS FOR CONNECTING WIRES THERETO

(75) Inventors: Gerhard Damaschke, Flörsheim; Frank Schlag, Hamburg; Karlheinz Wienand, Aschaffenburg, all of (DE)

(73) Assignee: Heraeus Electro-Nite International N.V, Houthalen (BE)

(*) Notice: Subject to any disclaimer, the term of this patent is extended or adjusted under 35 U.S.C. 154(b) by 0 days.

(21) Appl. No.: 09/472,368

(22) Filed: Dec. 23, 1999

Related U.S. Application Data

(62) Division of application No. 08/939,627, filed on Sep. 29, 1997, now abandoned.

(30) Foreign Application Priority Data

Sep. 30, 1996  (DE) ......................................... 196 40 058

(51) Int. Cl.⁷ ................................................. H01R 9/00
(52) U.S. Cl. .............................. 29/842; 29/843; 29/844; 29/865
(58) Field of Search .......................... 29/858, 869, 879, 29/843, 860, 842, 844, 865; 264/263

(56) References Cited

U.S. PATENT DOCUMENTS

| | | | |
|---|---|---|---|
| 3,383,457 A | 5/1968 | Schumacher et al. | |
| 3,751,801 A | * 8/1973 | Praeger et al. | |
| 3,960,425 A | 6/1976 | Kirk, Jr. et al. | |
| 4,076,365 A | 2/1978 | Ross et al. | |
| 4,255,853 A | * 3/1981 | Campillo et al. | |
| 4,627,674 A | 12/1986 | Hansher, Jr. et al. | |
| 4,715,119 A | * 12/1987 | Joosten | |
| 4,813,127 A | * 3/1989 | Braski et al. | .................. 29/825 |
| 4,871,319 A | 10/1989 | Babow | |
| 5,057,650 A | 10/1991 | Urushibata et al. | ........ 174/88 R |
| 5,669,789 A | 9/1997 | Law | ........................... 439/620 |
| 5,806,179 A | * 9/1998 | Hassanzadeh | ................ 29/843 |

\* cited by examiner

*Primary Examiner*—Carl J. Arbes
(74) *Attorney, Agent, or Firm*—Akin, Gump, Strauss, Hauer & Feld, L.L.P.

(57) ABSTRACT

A printed circuit board with at least one component part as a measuring resistor, heat resistor or measuring electrode arrangement has at least two contact pads connected with conductor paths for electrical and mechanically fast connection with lead ends of a jacketed connection cable stripped of their insulation, wherein the cable end with its outer jacket is positionable in a mounting element arranged immovably in relation to the printed circuit board at a distance from the contact pad of the conductor path. In a preferred embodiment, the mounting element has channel-shaped recesses for clamp fastening of the lead jacket, which is arranged with its lead exit area adjacent to a respective contact pad of the printed circuit board.

8 Claims, 4 Drawing Sheets

PROCESS FOR MANUFACTURING PRINTED CIRCUIT BOARDS AND PROCESS FOR CONNECTING WIRES THERETO

CROSS-REFERENCE TO RELATED APPLICATIONS

This application is a division of Application No. 08/939,627, filed Sep. 29, 1997, now abandoned.

The invention relates to a printed circuit board with at least one conductor path on a substrate with an electrically insulating surface serving as a carrier, wherein an electrically conducting and mechanically fast connection of the conductor path via contact pads is provided with a connection cable having at least two connecting wires mutually insulated from one another, as well as a process for producing a printed circuit board and for connecting the connecting wires, as well as a use of the printed circuit board.

A temperature sensor with a measuring resistor is known from DE 39 39 165, in which a small ceramic board serving as a carrier with a thin metal coating as a resistance layer is constructed, and contact surfaces are connected directly electrically conducting and mechanically fast with conductor paths electrically insulated from one another on a printed circuit board. A plastic foil, for example capton foil, is provided as a printed circuit board, wherein the conducting paths consist of copper or a copper-based alloy. The printed circuit board, which is located in a protective tube, is joined with an external connection cable via connecting pads, wherein the connecting cable is connected mechanically fast with the protective tube for the purpose of stress relief.

Furthermore, a fever thermometer is known from DE 31 27 727A1, in which a measuring resistance consisting of two component resistors is applied to a substrate board in thin layer technology, wherein the substrate is enclosed by a mass resistant to disinfectants, and external connection wires are connected with one end of the substrate board via solder points.

The known temperature sensors with printed circuit boards prove to be a problem in case a largely automated assembly is provided, since the alignment of the free ends of the connection cable with the provided solder contact surfaces requires an exact positioning. In practice, these assemblies require high standards with respect to the aptitude of the assembly personnel.

Furthermore, a temperature-measuring resistor consisting of a small ceramic board serving as a carrier with a thin metal coating as a resistance layer and contact surfaces, as well as an insulation layer protecting the resistance layer which is applied to a printed circuit board, is known from DE-GM 87 16 103. In order to provide a sure electrical and mechanical connection of the measuring resistor with a connection cable, the contact surfaces are connected directly electrically conducting and mechanically fast with the conductor paths of the printed circuit board. Even if a secure and largely automated application of the measuring resistor according to the description is to be expected, further-reaching measures for fastening and bonding a connection cable are not indicated.

Furthermore, a process for electrical bonding of printed circuit boards is known from DT 24 19 327 A1, in which electrically insulated wires in the form of conductor strips are inserted into borings of connector positions of the printed circuit board and joined by means of a solder pad. By connection of conductor strips with plugs and grip bands, a stress relief of the connector positions connected with the plug is accomplished. A possible stress relief of the connector positions on the printed circuit board is not provided.

SUMMARY OF THE INVENTION

An object of the invention is to create a largely automatable assembly of printed circuit boards, possibly in SMD technology. Moreover, a connection with stress relief between printed circuit board and at least one connecting wire should be achieved. Furthermore, a production process for printed circuit boards should be presented with which an economical manufacture is possible. In addition, a process for connecting connection wires and a use of the printed circuit boards should be indicated.

The object is accomplished in accordance with an arrangement of a printed circuit board having at least one conductor path with contact pads on an electrically insulting substrate surface being connectable by a melting process to lead wires stripped of their insulation from a jacketed connection cable, wherein an end of the cable is positioned in a mounting element fixedly arranged in relation to the conductor path at a distance from the contact pads.

The possibility of using standardized printed circuit board structures proves to be advantageous. In an advantageous configuration, mounting elements are provided with channel-shaped recesses for receiving jacketed cable ends, whose lead exit area is arranged adjacent to a respective contact surface. Here the possibility of automatable connection of connecting lands to contact pads of the conductor path proves to be beneficial. Further advantageous configurations of the arrangement are described and claimed hereinafter.

By connection of two or more contact pads with a conductor path, this can be favorably constructed as a resistance layer. It furthermore proves to be beneficial in connection with printed circuit boards that standard resistors adapted to the application in question can be used.

The object is further accomplished in accordance with the process for producing a printed circuit board, wherein the circuit board is manufactured as a monolithic preform by an injection molding process from plastic granulate, wherein a mounting element for receiving a jacketed connection cable end, projecting from a plane formed by the contact pads of the conductor path, is so constructed to include at least one channel-shaped recess with a cable-end exit area adjacent to at least one of the contact pads.

The sturdy connection technique of the conductor connections proves to be especially advantageous wherein the particular cable connection technique also makes possible manufacturing in the form of a panel with a field arrangement of measuring elements in a simple manner. A basic advantage of the process is to be seen in the possibility of automatic assembly of temperature sensors. In addition, quality control is essentially facilitated. Advantageous embodiments of the process are described and claim hereinafter.

The objective is moreover accomplished in accordance with the process for connecting cable ends to a printed circuit board, wherein the printed circuit board is inserted into a workpiece carrier and positioned above a solder jet with contact pads directed downwardly, wherein the cable is guided by a gripper along the printed circuit board longitudinal axis with its lead ends until it is arrested on a stop pin projecting upward between the lead ends, such that the cable ends with their jacket are inserted into recesses of the mounting, and the lead ends of the cable stripped of their insulation are situated below the contact pads and touch these, and that subsequently a solder flow or wave running out of the solder jet is conducted over the contact pads, which connects the lead wires stripped of their insulation to the contact pads in an electrically-conducting and mechanically-tight manner.

An advantageous configuration of the process is directed toward a joining of connecting cables with printed circuit boards which are, in addition, constructed as panels. The possibility of an economical manufacture owing to simultaneous processing of several printed circuit boards proves to be particularly favorable.

The object further is accomplished through use of the printed circuit boards of the invention for temperature sensors or heating elements. The object is also accomplished through use of the printed circuit boards as measurement electrodes.

BRIEF DESCRIPTION OF THE SEVERAL VIEWS OF THE DRAWING

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
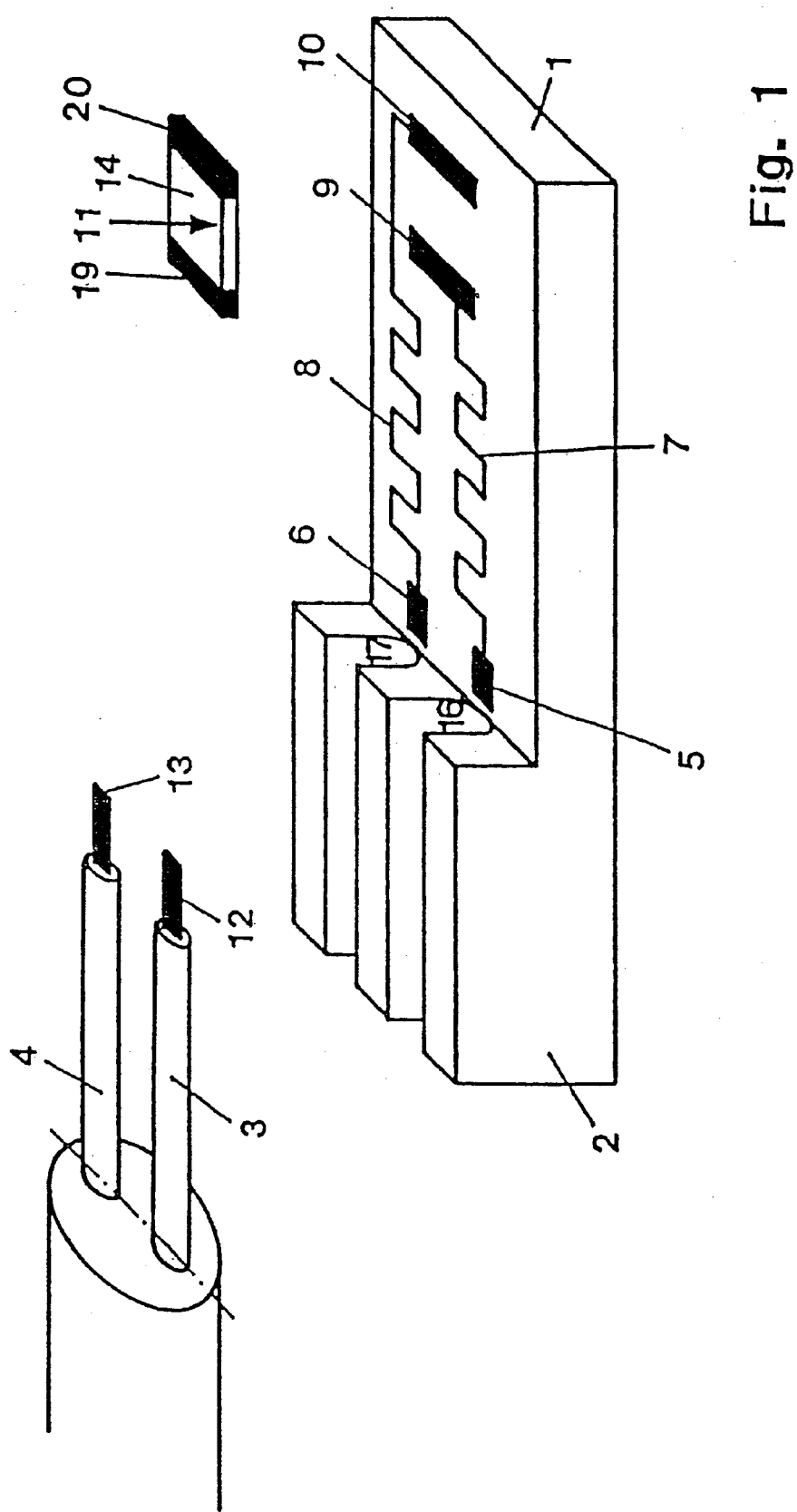
FIG. 1 shows a perspective representation of a printed circuit board with a measuring resistor to be applied and the trackings for the cable ends.

In accordance with FIG. 1, the sensor has a printed circuit board 1 constructed as a molded plastic part, which includes a monolithically integrated mounting for receiving connection cable ends 3, 4 as well as connection contact pads 5, 6 for the connection of connection cable ends. The contact pads 5, 6 are respectively connected with connection contact pads 9, 10 for a measuring resistor 11 through meander-shaped conductor paths 7, 8. The measuring resistor 11, depicted shortly before it is put down, has an electrical resistance layer 14 whose resistance behavior is a function of temperature. The cable, likewise depicted shortly before insertion, includes two parallel-directed connection cable ends 3, 4, from which respectively one or two conductor wires 12, 13 are to be connected with contact pads 5, 6. The outer jacket 15, 18 is in each case inserted into an upwardly open U-shaped, channel-like recess 16, 17 of the mounting 2 and held form-fitting by being squeezed into the mounting 2. In this way, the conductors 12, 13 lying inside can be connected respectively with one of the contact pads 5, 6. The contacting of the connection contact pads 5, 6 takes place through conductor paths 7, 8 with contact pads 9, 10, which are provided for electrical and mechanical joining of the contacts 19, 20 of measuring resistor 11. The longitudinal axis of the printed circuit board is designated with number 26 (see FIG. 5).

The printed circuit board 1 consists of a flat part for accommodating conductor paths and contact surfaces 5, 6, 7, 8, 9, 10 as well as a solidly integrated mounting 2 with U-shaped recesses 16, 17 for insertion of connection cable ends 3, 4. The production of a preform of the printed circuit board 1 preferably takes place with plastic granulate in an injection molding process, wherein the preform resulting there is in the form of a panel, that is, it is manufactured together with a plurality of preforms at the same time through injection molding, and whereby a metallization for forming contact surfaces and conductor paths subsequently takes place through a hot stamping process by means of hot stamping foil.

Figure 2:
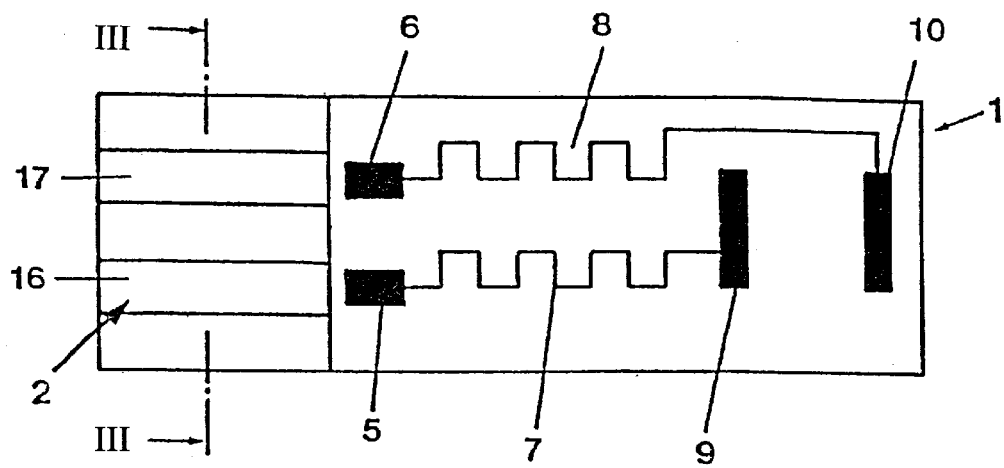
FIG. 2 shows a plan view of a printed circuit board with non-installed measuring resistor and mounting for the cable guide for the cable ends.

An exemplary embodiment of the printed circuit board is explained in greater detail on the basis of FIG. 2 in a plan view. The mounting 2 of printed circuit 1 board produced by injection molding is recognizable on the basis of FIG. 2, wherein the U-shaped recesses 16, 17 for mounting the cable ends 3, 4 (not depicted here) are also recognizable from above. The conductors, as they are designated by 12, 13 in FIG. 1, are joined with the contact pads 5, 6 for mechanical bonding and electrical contacting, wherein at the same time a contacting with contact pads 9, 10 arises for the measuring resistor 11. In the region of the cable ends, the conductors project at a distance of about 2 to 4 cm beyond the cable edge and mounting so that a simple automatable connection technique can be developed.

With an automated outfitting, for example, the leads 3, 4(FIG. 1) are positioned over recesses 16, 17 with a gripper and pressed on. Soldering the conductors 12, 13 onto contact pads 5, 6 takes place automatically for all positions with a selective solder wave, as this will be subsequently explained on the basis of FIG. 6.

Figure 3:
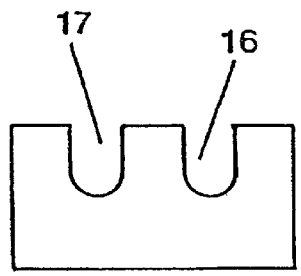
FIG. 3 illustrates a cross section along the section surface III-III of FIG. 2.

FIG. 3 illustrates the cross section III-III in accordance with FIG. 2 prior to insertion of the cable ends.

Figure 4:
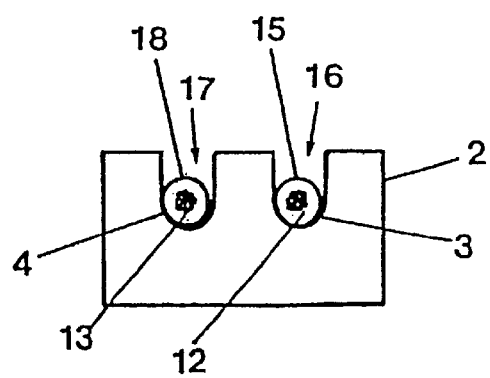
FIG. 4 depicts a cross section similar to FIG. 3 wherein the cable ends, however, are connected with the printed circuit board.

On the basis of the cross section in FIG. 4, the connection cable ends 3, 4, respectively inserted in U-shaped recesses 16, 17, are recognizable, wherein the conductors 12, 13 consist of a plurality of individual wires. A stress relief results in practice only through "squeezing" the leads 3, 4 with outer jackets 18, 19 into the U-shaped recesses 16, 17.

A conductor path constructed as a resistance layer can have a meanderlike structure, as is known, for example, from German Patent 25 27 739 or U.S. Pat. No. 4,050,052. Preferably plastics, such as PS, ABS and PPS are used as the material for the printed circuit board, wherein ABS is suitable for temperatures up to 130° C., PPS for temperatures above 150° C. Conductor paths and contact pads are preferably made of a platinum group metal.

Figure 5:
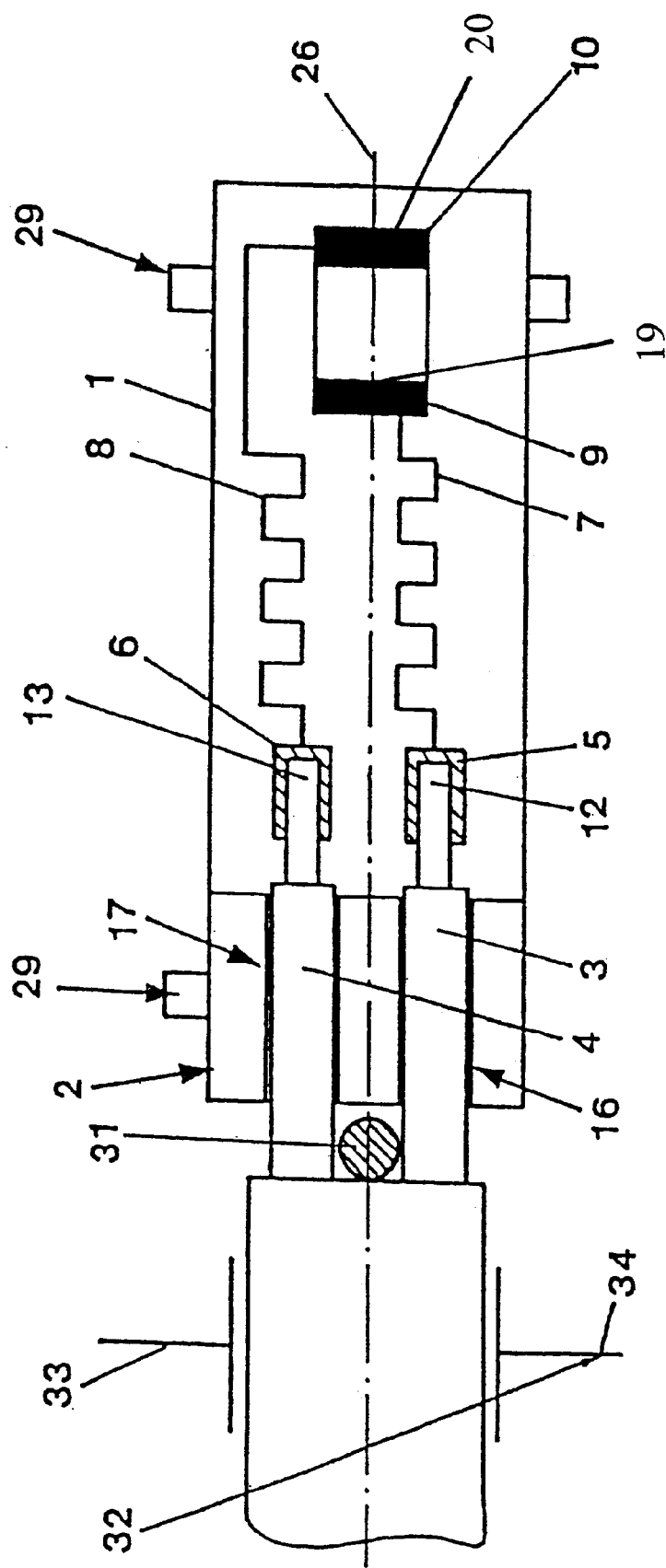
FIG. 5 illustrates schematically the process for producing the connection between printed circuit board and cable end.

In accordance with FIG. 5, printed circuit board 1 is accommodated in a work piece carrier, here symbolically indicated by numeral 29. Connected with the work piece carrier are a stop pin 31 as well as a gripping device 32 which clamps the cable end with two tong-like, adjustable gripper arms 33, 34, and guides this in the direction of the printed circuit board 1 along its axis 26 until it reaches the stop pin 31. The lead ends 3, 4 of the connection cables are thereby inserted or clamped into the recesses 16, 17 of the mounting element 2, whereby the conductor wires 12, 13, stripped of their insulation, touch or overlie the contact pads 5, 6.

Figure 6:
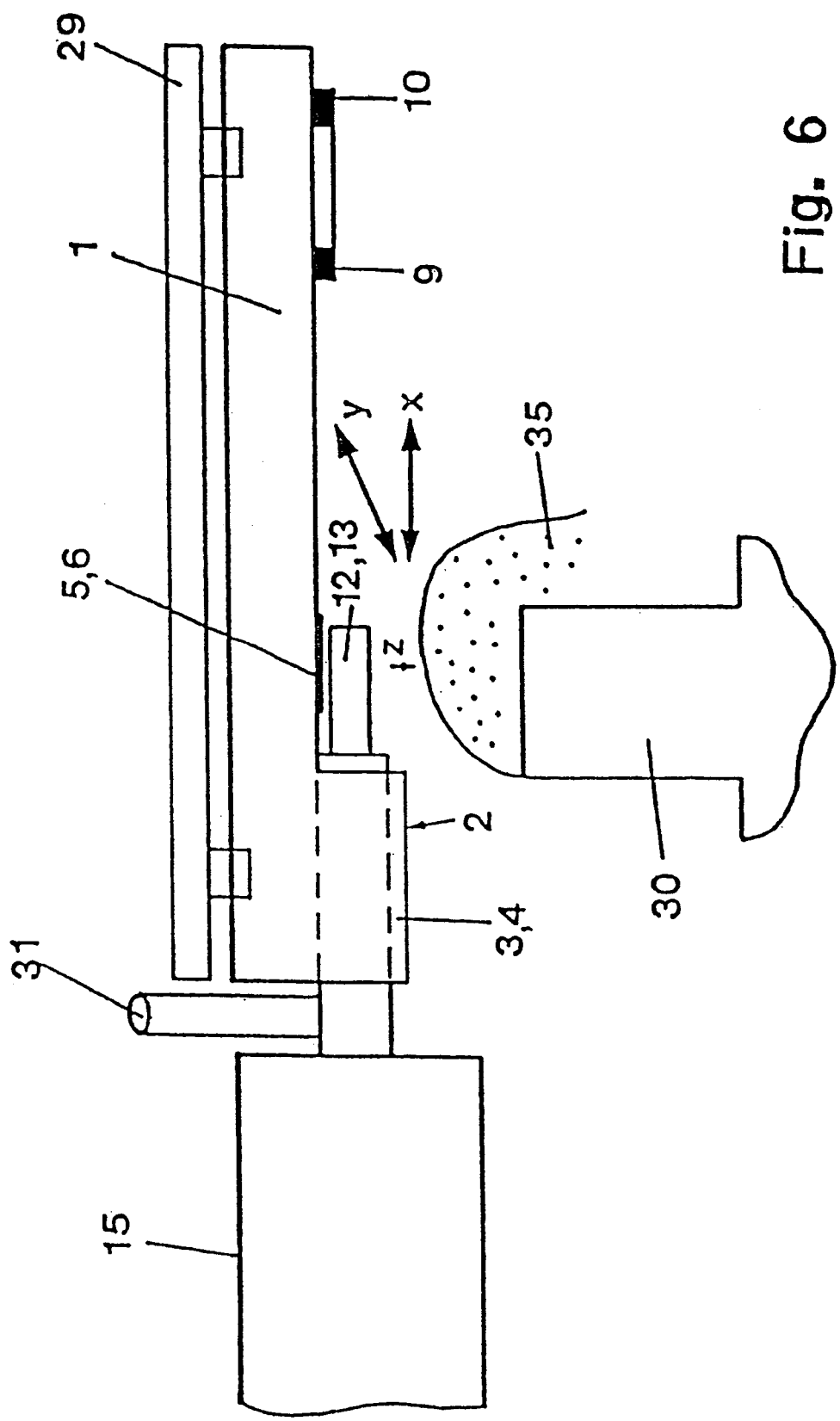
FIG. 6 schematically represents the soldering step.

In accordance with FIG. 6, printed circuit board 1 is positioned in the work piece carrier in such a way that the contact pads 5, 6 are turned toward a solder jet 30, from which a schematically-represented solder wave 35 emerges, which wets the contact pads with solder together with the insulation-free ends 12, 13 of the connection lead ends 3, 4 lying on the pads, when the work piece carrier 29 is lowered in the Z-direction. Furthermore, on the basis of FIG. 6, stop pin 31 for positioning the cable end, as well as the jacketed lead ends 3, 4 situated in mounting element 2, are recognizable. After the contact pads 5, 6 and the insulation-free wire lead ends 12, 13 are wetted with the solder wave, work piece carrier 29 is raised, and after hardening of the solder, a new printed circuit board for connection with a new cable end is picked up. The diameter of the solder jet 30 is approximately 10 mm.

It is also possible to provide for the connection of a plurality of connection cables for printed circuit boards located in a panel, wherein several parallel-directed cable ends are then fed to the contact pads of a panel.

It is furthermore possible to install the measuring resistors or heat resistors or electrodes provided with the connection contact pads 9, 10 in the same operation with the joining of conductor ends 12, 13 to the connection contact pads 5, 6.

Following hardening and possible separation (of individual printed circuit boards from a multi-board panel), the contact pads of the printed circuit boards are connected with stable connection wires or connection cables, which can be handled in further assembly techniques without problems.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A process for manufacturing a printed circuit board having at least one conductor path and connection contact pads connected with it for at least one connection lead, wherein the printed circuit board (1) is manufactured as a monolithic preform by an injection molding process from plastic granulate, wherein a mounting element (2) for receiving at least one jacketed connection cable end (3, 4), projecting from a plane formed by contact pads (5, 6) of the conductor path (7, 8), is so constructed that it includes at least one channel-shaped recess (16, 17) with a cable end exit area adjacent to at least one contact pad (5, 6).

2. The process according to claim 1, wherein conductor paths (7, 8) and contact pads (5, 6, 9, 10) are applied to the preform as metallization in a stamping process.

3. The process according to claim 1, wherein at least two preforms of printed circuit boards are manufactured at the same time as a panel in an injection molding process.

4. The process according to claim 2, wherein the conductor paths (7, 8) and contact pads (5, 6, 9, 10) are applied to the preform as a hot stamping foil by a stamping die.

5. The process according to claim 3, wherein the preforms of individual printed circuit boards contained in the panel are outfitted with a resistor (11) via the contact pads, are connected with the connection cable ends, and are subsequently separated.

6. The process according to claim 5, wherein the resistor (11) is prepared by metallizing the edges for soldering onto the contact pads (9, 10).

7. A process for connecting connection wires of a cable with projecting lead ends stripped of their insulation to contact pads on a printed circuit board having at least one conductor path on a substrate serving as a carrier with an electrically insulating surface, wherein an electrically conducting and mechanically tight connection of the conductor path via contact pads is provided with at least two mutually-insulated connection leads of at least one jacketed connection cable, wherein the contact pads (5 6) of the conductor path (7, 8) are connectable by a melting process to leads (12, 13) stripped of their insulation from the at least one jacketed connection cable, wherein an end of the cable is positionable in at least one mounting element (2) immovably arranged in relation to the conductor path (7, 8) at a distance to the contact pads (5, 6) of the conductor path, wherein the printed circuit board (1) is inserted into a work piece carrier (29) and positioned above a solder jet (30) with the contact pads (5, 6) directed downwardly, wherein the cable is guided by grippers (32) with its lead ends until it is arrested at a stop pin (31) projecting between the lead ends along a longitudinal axis (26) of the printed circuit board, such that the cable ends (3, 4) are inserted with their jackets in recesses (16, 17) of the mounting element (2), and the insulation-free lead wires (12, 13) of the cable are situated under the contact pads (5, 6) and touch these, and wherein a solder wave (35) running over to the contact pads (5, 6) is subsequently conducted out of the solder jet (30), which solder wave connects the lead wires (12, 13) with the contact pads (5, 6) in an electrically-conducting and mechanically-tight manner.

8. The process according to claim 7, wherein at least two printed circuit boards (1) in a form of a panel are inserted into a work piece carrier, and wherein two grips guide two connection cable ends parallel into mounting recesses (16, 17), and lead wires (12, 13) stripped of their insulation are respectively connected with contact pads (5, 6).

* * * * *